United States Patent
Hawkins, III et al.

(10) Patent No.: US 11,029,734 B2
(45) Date of Patent: Jun. 8, 2021

(54) CYCLING COMPUTER

(71) Applicant: Wahoo Fitness LLC, Atlanta, GA (US)

(72) Inventors: Harold M. Hawkins, III, Atlanta, GA (US); Jose R. Mendez, Columbus, OH (US); Stacy C. Perlis, Atlanta, GA (US); Shane A. Byler, Mableton, GA (US); William C. Phelps, III, Lawrenceville, GA (US); Dimitris Katsanis, Nottingham (GB)

(73) Assignee: Wahoo Fitness LLC, Atlanta, GA (US)

( * ) Notice: Subject to any disclaimer, the term of this patent is extended or adjusted under 35 U.S.C. 154(b) by 45 days.

(21) Appl. No.: 15/868,762

(22) Filed: Jan. 11, 2018

(65) Prior Publication Data

US 2018/0203488 A1 Jul. 19, 2018

Related U.S. Application Data

(60) Provisional application No. 62/446,098, filed on Jan. 13, 2017, provisional application No. 62/507,020, filed on May 16, 2017.

(51) Int. Cl.

| | |
|---|---|
| *G06F 1/16* | (2006.01) |
| *H05K 5/02* | (2006.01) |
| *B62J 11/00* | (2020.01) |
| *B62J 99/00* | (2020.01) |
| *B62J 45/20* | (2020.01) |

(52) U.S. Cl.
CPC ............ *G06F 1/1656* (2013.01); *B62J 11/00* (2013.01); *B62J 99/00* (2013.01); *G06F 1/1626* (2013.01); *G06F 1/1632* (2013.01); *H05K 5/0204* (2013.01); *B62J 45/20* (2020.02); *G06F 1/1637* (2013.01)

(58) Field of Classification Search
CPC ...... G06F 1/163; G06F 1/1656; G06F 1/1637; G06F 1/1626; G06F 1/1632; H05K 5/0204; H05K 7/00; B62J 11/00; B62J 2099/0013; B62J 99/00; B62J 45/20
See application file for complete search history.

(56) References Cited

U.S. PATENT DOCUMENTS

| | | | | |
|---|---|---|---|---|
| 6,227,068 B1 * | 5/2001 | Masui | .................... | B62K 23/02 |
| | | | | 200/61.85 |
| 6,305,241 B1 * | 10/2001 | Masui | ..................... | B62J 11/00 |
| | | | | 224/420 |

(Continued)

*Primary Examiner* — Rockshana D Chowdhury
(74) *Attorney, Agent, or Firm* — Polsinelli PC

(57) ABSTRACT

A cycling computer includes a housing for enclosing an electronics package and a mount for removably securing the housing to the front of a bicycle. The housing has a wedge-shaped profile defined by a leading edge and a lower front surface extending rearward and downward to a bottom surface. The computer mount includes a cradle for removably receiving the housing. A bracket arm extends between the cradle and a mounting adapter which is used to connect to a handlebar or otherwise. The cradle further includes a curved underside surface extending rearward from a forward edge that is sized and shaped to align with the lower front surface of the computer housing to form a substantially smooth and continuous aerodynamic surface from the leading edge of the computer housing to a rear edge of the cradle.

24 Claims, 8 Drawing Sheets

(56) References Cited

U.S. PATENT DOCUMENTS

| | | | |
|---|---|---|---|
| 6,584,872 B1* | 7/2003 | Kojima | B62K 21/125 |
| | | | 74/551.8 |
| 6,774,771 B2* | 8/2004 | Takeda | B62M 25/08 |
| | | | 280/260 |
| 9,402,016 B1* | 7/2016 | Hidalgo | H04N 5/2252 |
| 2005/0180150 A1* | 8/2005 | Okada | B62J 11/00 |
| | | | 362/473 |
| 2010/0246199 A1* | 9/2010 | Ma | B62J 6/02 |
| | | | 362/474 |
| 2013/0098959 A1* | 4/2013 | Onogi | B62K 21/12 |
| | | | 224/419 |
| 2015/0183478 A1* | 7/2015 | Tate | B62J 11/00 |
| | | | 224/441 |

* cited by examiner

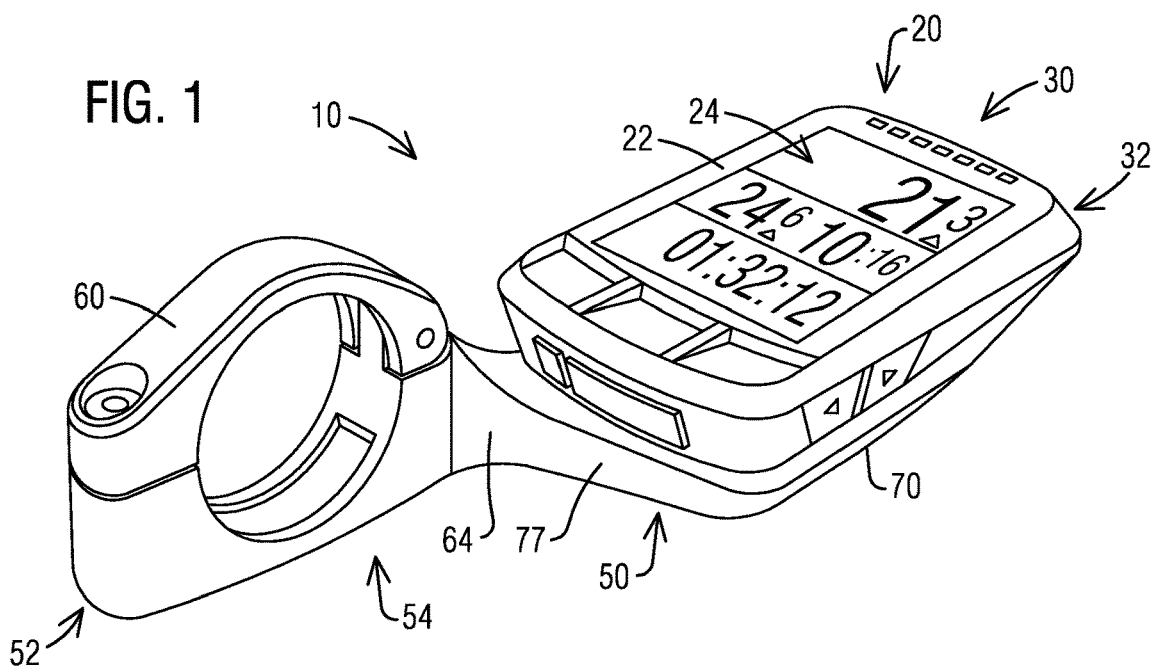
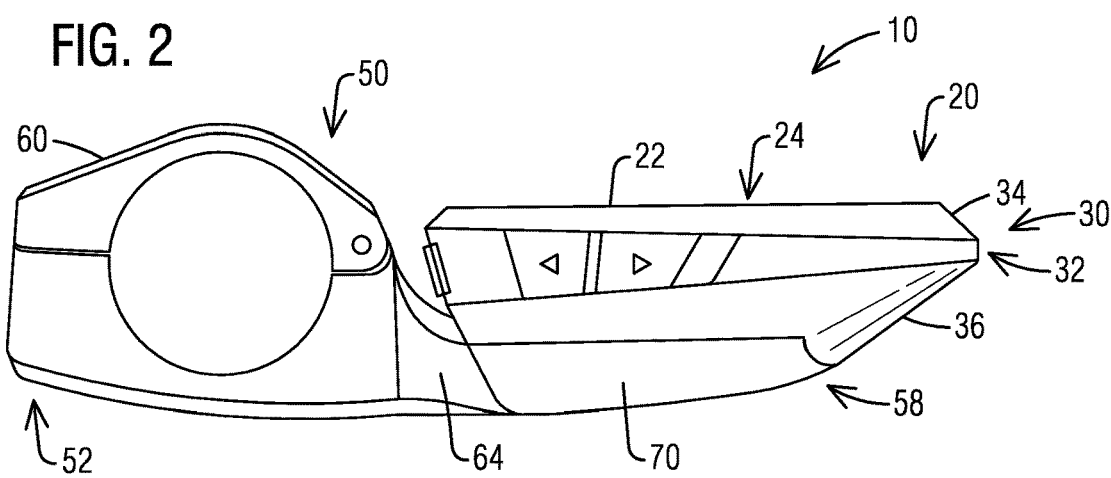
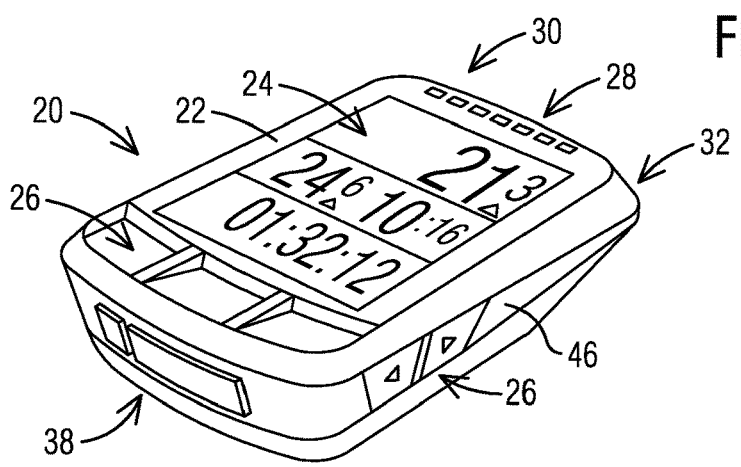

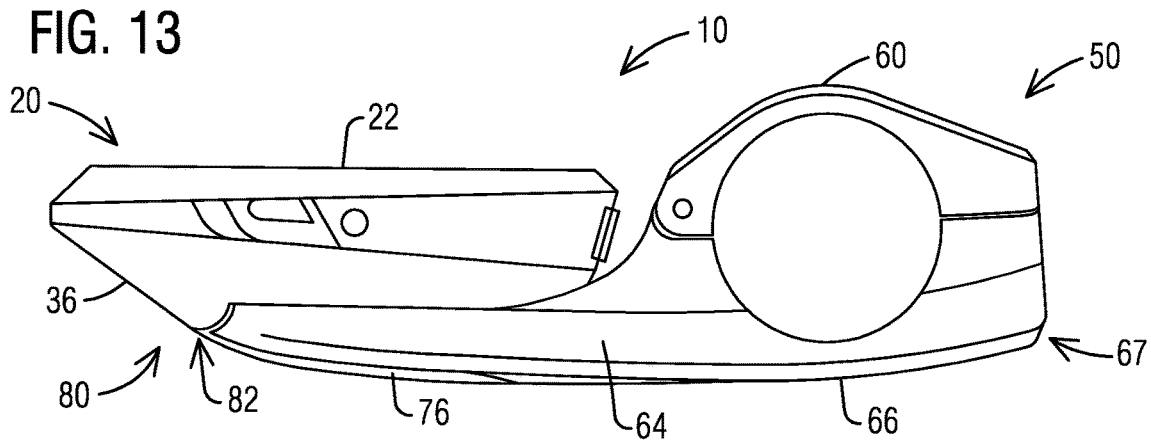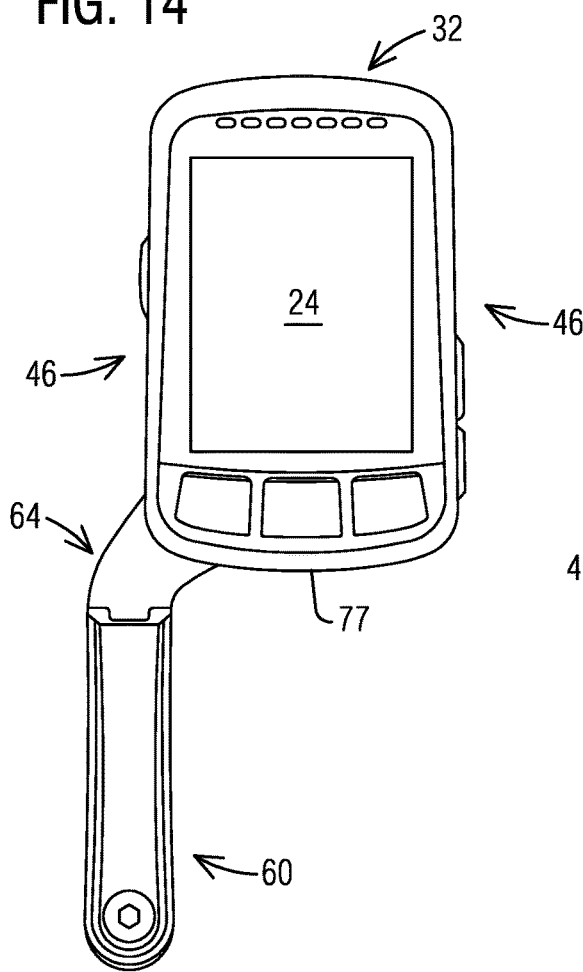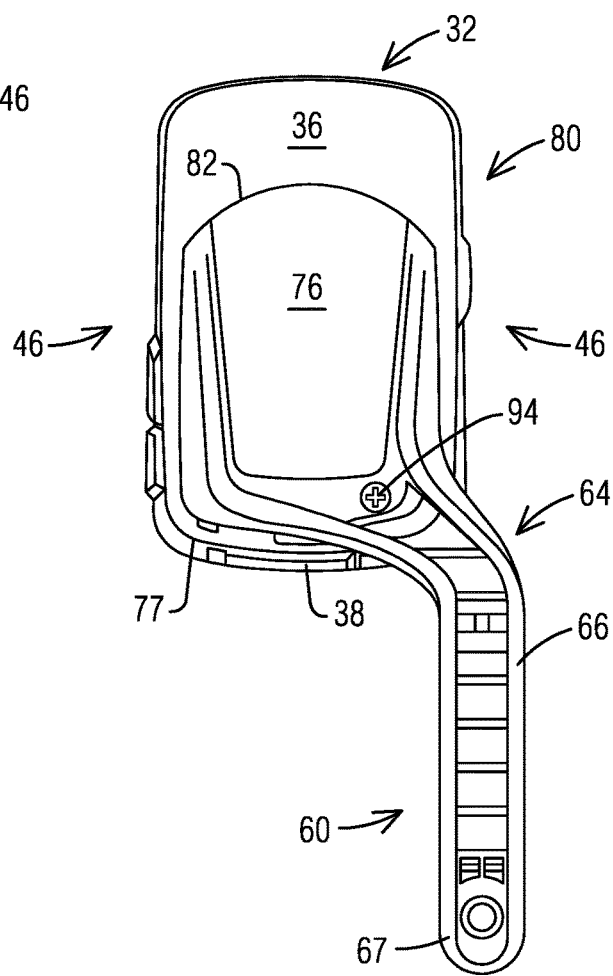

US 11,029,734 B2

CYCLING COMPUTER

CROSS-REFERENCE TO RELATED APPLICATIONS

The present application is a non-provisional application and claims priority under 35 U.S.C. § 119 to provisional application No. 62/446,098 titled "Cycling Computer," filed Jan. 13, 2017, which is hereby incorporated by reference. The present application also claims priority under 35 U.S.C. § 119 to provisional application No. 62/507,020 titled "Cycling Computer," filed May 16, 2017, which is hereby incorporated by reference.

TECHNICAL FIELD

The present disclosure generally relates to cycling computers, cycling computer housings, and apparatus for mounting cycling computers to bicycles.

SUMMARY

Briefly described, one embodiment of the present disclosure comprises a cycling computer that includes a computer housing for enclosing and protecting an electronics package, and a computer mount for securing the computer housing to the front of a bicycle. The computer housing further comprises a front end having a wedge-shaped profile that is defined by a leading edge and a lower front surface extending rearward and downward from the leading edge to a bottom surface of the computer housing, and a first coupling member formed into or extending from the bottom surface of the computer housing. The computer mount, in turn, further comprises a cradle at a distal end for removably receiving the computer housing, a mounting adapter at a proximal end for coupling to the front of the bicycle, and a bracket arm extending between the cradle and the mounting adapter. The cradle includes a second coupling member formed into an upper side of the cradle and engageable with the first coupling member to removably secure the computer housing to the cradle, and a curved underside surface extending rearward from a forward edge that is sized and shaped to align with the lower front surface of the computer housing and form a substantially smooth and continuous aerodynamic surface from the leading edge of the computer housing to a rear edge of the cradle when the computer housing is secured within the cradle.

Another embodiment of the present disclosure comprises a cycling computer that includes a computer housing for enclosing and protecting an electronics package, and a computer mount for securing the computer housing to the front of a bicycle. The computer housing further comprises a front end having a faceted leading edge profile defined by an upper facet surface and a lower facet surface, with the lower facet surface extending rearward and downward beyond a bottom surface of the housing to form a projecting underside ridge with a backside face, and a first coupling member extending downward from the bottom surface of the computer housing behind the underside ridge. The computer mount, in turn, further comprises a mounting adapter at a proximal end for coupling to the front of the bicycle, a cradle at a distal end for removably receiving the computer housing, and a bracket arm extending between the mounting adapter and the cradle. The cradle includes a forward edge sized and shaped to be complementary with the backside face of the underside ridge, a curved underside surface extending rearward from the forward edge, and a second coupling member behind the forward edge and engageable with the first coupling member to removably secure the computer housing to the cradle. In addition, the lower facet surface of the computer housing and the underside surface of the cradle align to form a substantially smooth and continuous aerodynamic surface from the leading edge of the computer housing to a rear edge of the cradle when the computer housing is secured within the cradle.

Yet another embodiment of the present disclosure comprises a cycling computer that includes a computer housing for enclosing and protecting an electronics package, and a computer mount for fixedly securing the computer housing to the front of a bicycle. The computer housing comprises a first coupling member formed into a bottom surface of the computer housing, while the computer mount comprises a cradle at a distal end for removably receiving the computer housing, a mounting adapter at a proximal end for coupling to the front of the bicycle, and a bracket arm extending between the cradle and the mounting adapter. The cradle includes a second coupling member formed into an upper side of the cradle and engageable with the first coupling member to initially the computer housing to the cradle. The cycling computer further includes a fastening mechanism interconnected between the computer housing and the computer mount to fixedly secure the computer housing to the computer mount.

The invention will be better understood upon review of the detailed description set forth below taken in conjunction with the accompanying drawing figures, which are briefly described as follows.

BRIEF DESCRIPTION OF THE DRAWINGS

FIG. 1 is a rear topside perspective view of a cycling computer, in accordance with a representative embodiment of the present disclosure.

FIG. 2 is a side view of the cycling computer of FIG. 1.

FIG. 3 is a rear topside perspective view of the isolated computer housing for the cycling computer of FIG. 1.

FIG. 13 is a side view of the assembled cycling computer of FIG. 1 with the computer housing mounted to the cradle portion of the computer mount.

FIG. 14 is a top view of the assembled cycling computer of FIG. 13.

FIG. 15 is a bottom view of the assembled cycling computer of FIG. 13.

Figure 4:
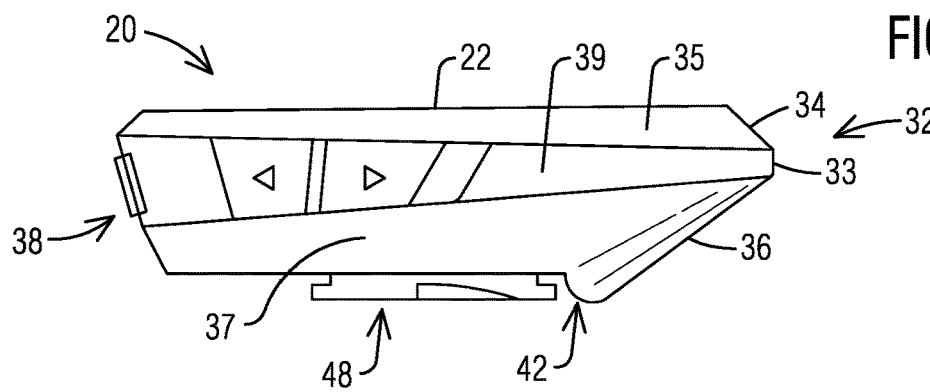
FIG. 4 is a side view of the computer housing of FIG. 3.

Those skilled in the art will appreciate and understand that, according to common practice, various features and elements of the drawings described above are not necessarily drawn to scale, and that the dimensions of the various features and elements may be expanded or reduced to more clearly illustrate the embodiments of the present disclosure described therein.

DETAILED DESCRIPTION

The following description, in conjunction with the accompanying drawings described above, is provided as an enabling teaching of exemplary embodiments of a cycling computer alone or in combination with a computer mount for mounting the cycling computer to a bicycle, such as to the handlebar of a bicycle, although it may also be used with other mobile devices such as scooters, mopeds, motorcycles, e-bikes, etc. The housing of the cycling computer itself includes features that provide aerodynamic advantages. Further, the cycling computer, when coupled with the computer mount, collectively provides aerodynamic advantage. Moreover, the cycling computer or cycling computer housing may also be mounted in a position and/or orientation that minimizes aerodynamic resistance and reduces drag while cycling, while providing such advantages over a range of orientations or favorable viewing angles suitable to individual riders for improved viewing ergonomics and readability of a computer display located at the top surface of the cycling computer housing. As described herein, these and other advantages of the cycling computer can provide several significant advantages and benefits over other cycling computer designs available in the art. However, the recited advantages are not meant to be limiting in any way, as one skilled in the art will appreciate that other advantages may also be realized upon practicing the present disclosure.

Furthermore, those skilled in the relevant art will also recognize that changes can be made to the described embodiments while still obtaining the beneficial results. It will further be apparent that some of the advantages and benefits of the described embodiments can be obtained by selecting some of the features of the embodiments without utilizing other features, and that features from one embodiment may be combined with features from other embodiments in any appropriate combination. For example, any individual or collective features of method embodiments may be applied to apparatus, product or system embodiments, and vice versa. Accordingly, those who work in the art will recognize that many modifications and adaptations to the embodiments described are possible and may even be desirable in certain circumstances, and are a part of the disclosure. Thus, the present disclosure is provided as an illustration of the principles of the embodiments and not in limitation thereof, since the scope of the invention is to be defined by the claims.

Referring now in more detail to the drawing figures, wherein like parts are identified with like reference numerals throughout the several views, FIGS. 1-2 illustrate one embodiment of the cycling computer 10 (also referred to herein as a cycling computer apparatus) having an integrated aerodynamic shape that can minimize the aerodynamic resistance and drag, when mounted to the front of the bicycle, that is created by the cycling computer 10 during a bike ride. The cycling computer 10 comprises a computer housing 20 for enclosing and protecting an electronics package of the bicycling computer, and which computer housing generally includes an electronic display 24 formed into a top surface 22 thereof. The cycling computer 10 further comprises a computer mount 50, such as "Out Front" mount 54, having a mounting adapter 60 at a proximal end 52 for coupling to the front of the bicycle, a substantially horizontal cradle 70 at a distal end 58 for removably receiving the computer housing 20, and a bracket arm 64 extending between the mounting adapter 60 and the cradle 70. The bottom surface of the computer housing 20 can be removably received within or attached to the top of the cradle 70 to secure the computer housing 20 in a locked and 'in-use" position within the cradle, with a front end 30 extending forwardly from the distal end 58 of the computer mount, and out in front of the handlebars, so that a faceted leading edge 32 of the computer housing 20 can be the foremost leading edge for the bicycle frame or body.

As shown in more detail in FIGS. 3-9, the computer housing 20 can comprise a multi-faceted and wedge-shaped aerodynamic body made from molded hard plastic or similar material that can provide a rigid, sturdy, and shock-resistant enclosure for the electronics package and display 24 contained therein. A majority portion of the top surface 22 of the computer housing 20 can comprise a transparent cover for the electronic display 24 of the electronics package that is configured for easy visibility for the bike rider during a bike ride. In one aspect the computer housing 20 can further include push buttons 26 formed into the top surface 20 and side surfaces 46 that allow for adjustment of the display, as well as a number of LED indicators 28 that may be used to convey additional useful information to the rider. The display may also be a touch screen display.

The front end 30 of the computer housing 20 can provide an aerodynamic wedge-shaped and/or faceted leading edge profile 32 defined by an upper facet surface 34 that extends rearward and upward to the top surface 22, and a lower facet surface 36 that extends rearward and downward to the bottom surface 44 of the computer housing. As provided in the illustrated embodiment of the computer housing 20, in one aspect the faceted leading edge profile 32 can further include a thin, front edge or center facet 33 between the upper facet surface 34 and the lower facet surface 36, and which can be continuously curved around the front end 30 of the computer housing to define the leading edge 32. It will be appreciated, however, that a variety of different aerodynamic faceted profiles for the leading edge are also possible and may be considered to fall within the scope of the present disclosure.

Figure 5:
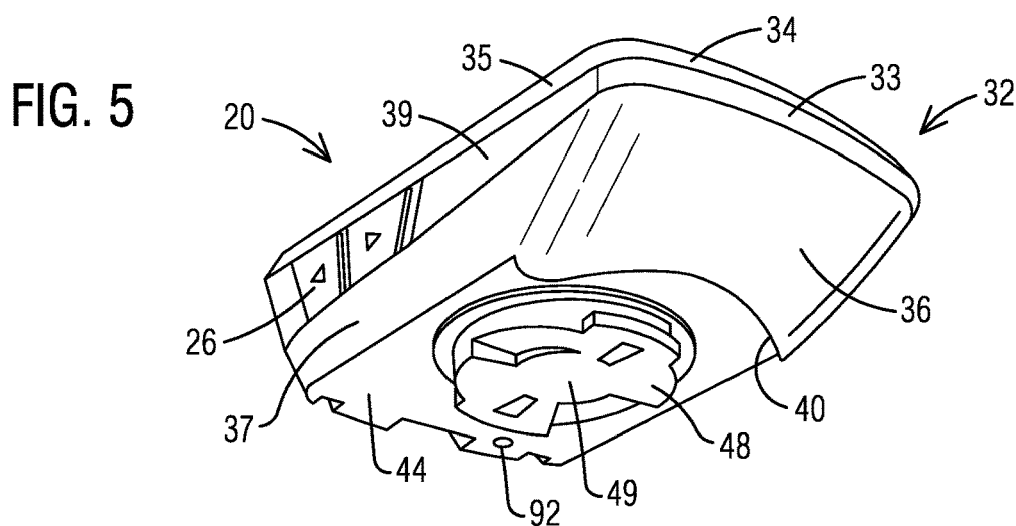
FIG. 5 is a front underside perspective view of the computer housing of FIG. 3.
Figure 6:
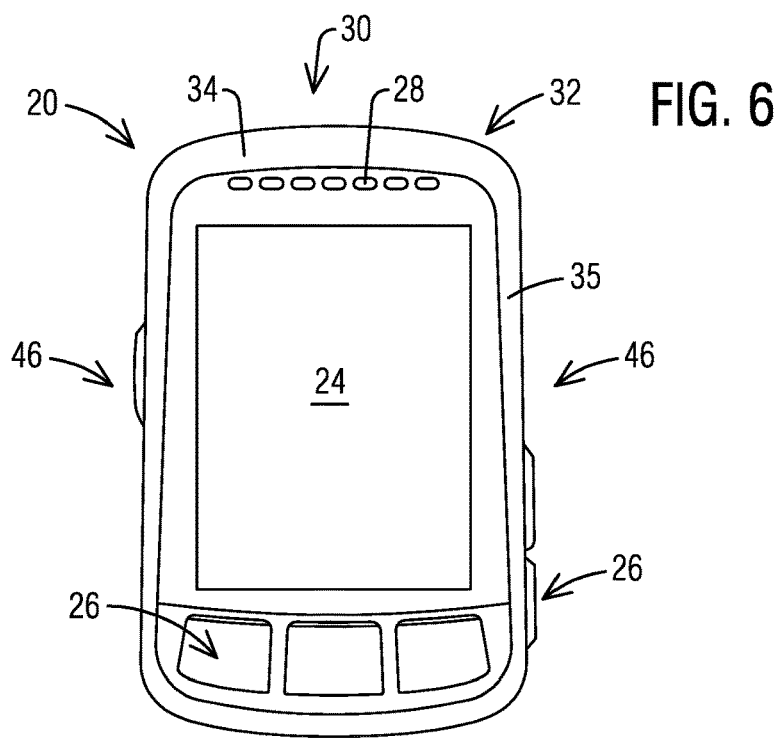
FIG. 6 is a top view of the computer housing of FIG. 3.
Figure 8:
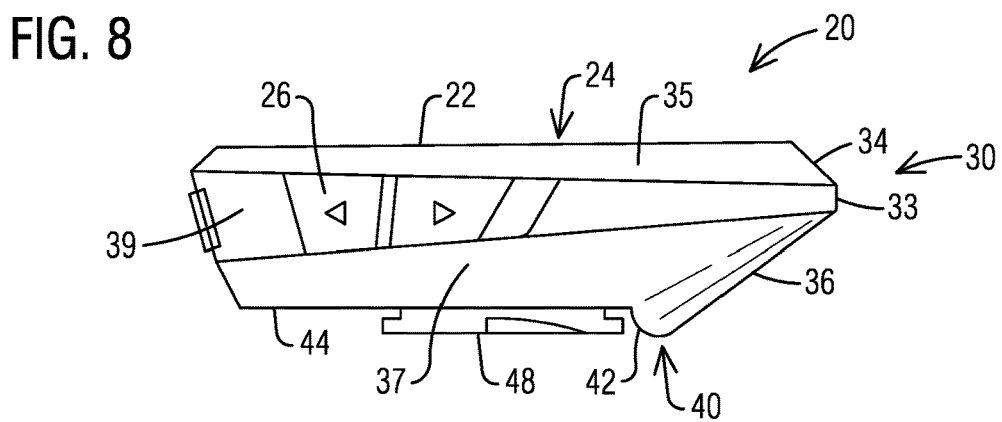
FIG. 8 is another side view of the computer housing of FIG. 3.
Figure 9:
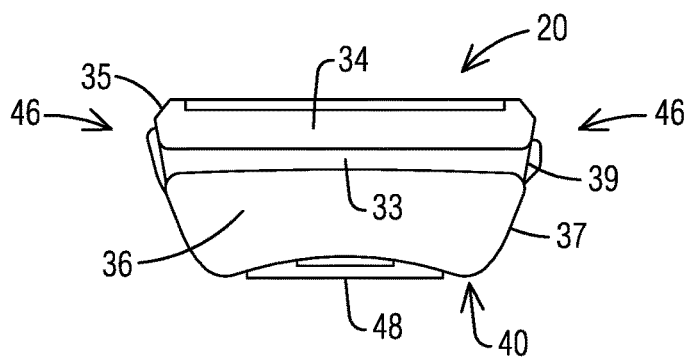
FIG. 9 is a front end view of the computer housing of FIG. 3.

As shown in FIGS. 4, 5, and 8, in one embodiment the lower facet surface 36 can extend downward beyond the level of the bottom surface 44 of the computer housing 20 to form a downward projecting underside ridge 40 with a backside face 42. A first coupling member 48 can also be formed with and/or extend downward from the bottom surface 44 of the housing 20 behind the underside ridge 42. As discussed in more detail below, the first coupling member 48 can be configured to engage a second coupling member formed into the top side 74 or surface of the cradle 70 to removably secure the computer housing 20 to the cradle 70 of the computer mount 50. In one aspect the two coupling members can form a rotary-type attachment system in which the first coupling member 48 rotatably engages with the second coupling member by pivoting around an axis of rotation located at the center point 49 of the first coupling member 48. Accordingly, in embodiments of the computer housing 20 having both an underside ridge 40 and a rotary-type attachment system, the backside face 42 of the underside ridge 40 can also be formed into the shaped of a curve or partial arc that is centered around same center point 49 of the first coupling member 48. Furthermore, it will be appreciated that in other embodiments the lower facet surface can curve directly into the bottom surface of the housing without extending below the level the bottom surface to form an underside ridge 42.

Also shown in FIGS. 3-9 are the sides 46 of the computer housing 20 that can continuously taper laterally outward from the front end 30 to the back end 38 to form an aerodynamic wedge-shaped body that can reduce the wind resistance and drag as the cycling computer is driven forwardly through the air in front of the bicycle. Moreover, the sides 46 of the computer housing 20 can also have faceted side edge profiles, and in one aspect can have upper side facet surfaces 35 that merge smoothly (e.g. with rounded edges or corners) with the upper front facet surface 34, and lower side facet surfaces 37 that merge smoothly with the lower front facet surface 36 extending rearward and downward from the leading edge profile 32. In some embodiments the faceted side edges 46 can further include center facet surfaces 39 between the upper side facet surfaces 35 and the lower side facet surfaces 37 that merge smoothly with the front edge or center facet 33. As indicated above, the corners, edges, and transitions between facet surfaces can be rounded or smoothly curved so as enhance low-friction laminar airflow around the computer housing 20, while at the same time reducing or minimizing any sharp directional changes in the laminar airflow that would lead to increased aerodynamic resistance and/or separation of the airflow from the computer housing 20 with the potential for increased aerodynamic drag.

Figure 10:
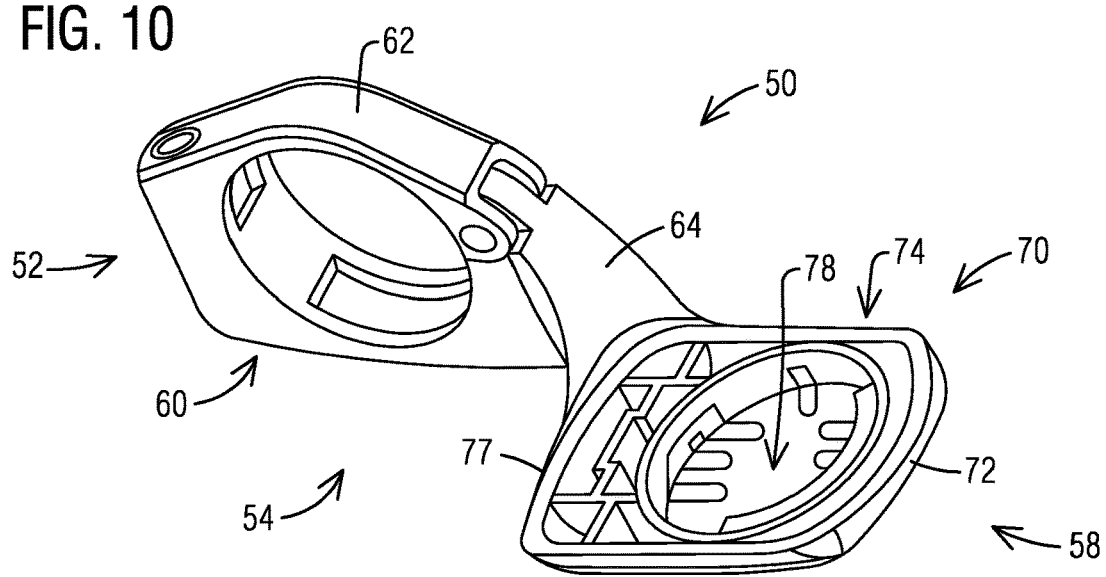
FIG. 10 is a front topside perspective view of the isolated computer mount for the cycling computer of FIG. 1.
Figure 12:
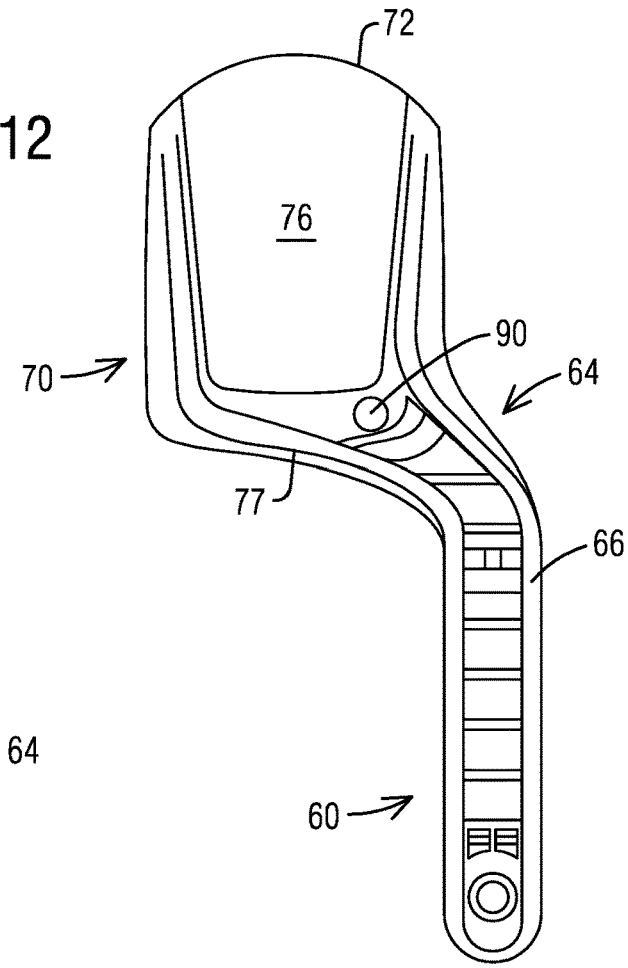
FIG. 12 is a bottom view of the computer mount of FIG. 10.
Figure 11:
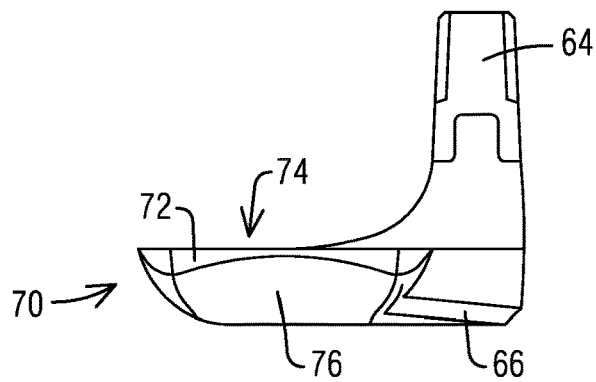
FIG. 11 is a front view of the computer mount of FIG. 10.
Figure 16:
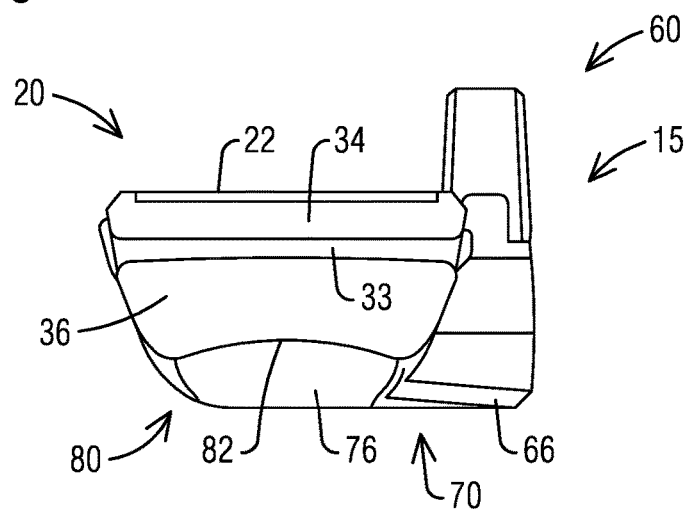
FIG. 16 is a front side view of the assembled cycling computer of FIG. 13.

With reference to FIGS. 10-12, the computer mount 50 of the cycling computer can have a proximal end 52 nearest to the rider of the bicycle, and a distal end 58 extending forwardly and away from the rider. The computer mount 50 can further include a mounting adapter 60 at the proximal end 52 for coupling to the front of the bicycle, a substantially horizontal cradle 70 at the distal end 58 for removably receiving the computer housing 70, and a bracket arm 64 extending between the mounting adapter 60 and the cradle 70. As known to one skilled in the art of bicycle riding, this type of computer mount 50 may be referred to as an "Out Front" mount 54 for positioning the cycling computer out in front of the frame or handlebars of the bicycle. In addition, the bracket arm 64 can include a continuously-curved transition section that extends from one side of cradle 70 so as to locate the mounting adapter 60 in an offset position relative to the cradle, thereby enabling the positioning of the computer housing 20 in front of the stem or center of the handlebars.

In the illustrated embodiment the mounting adapter 60 at the proximal end 52 of the computer mount 50 can comprise a coupling ring 62 for coupling around a substantially horizontal portion of a tubular handlebar. However, it is contemplated that other types of mounting adapters may also be used, including but not limited to those that may secure the computer mount 50 to the head tube of the bicycle frame, to the stem, or a split design with spaced apart coupling rings to secure the computer mount 50 to the handlebars on both side of the stem, and the like, all of which are considered to fall within the scope of the present disclosure.

In the illustrated embodiment the cradle 70 can extend forwardly from the bracket arm 64 in a substantially horizontal orientation with a top side 74 or surface with a second coupling member 78 formed therein that is configured to couple with the first coupling member 48 extending downward from the bottom surface 44 of the computer housing 20, so as to removably secure the computer housing 20 to the cradle 70. The horizontal cradle 70 can further include a curved underside surface 76 extending rearward from a forward edge 72 that is sized and shaped to be complementary, in some embodiments, with the backside face 42 of the underside ridge 40. For instance, in some aspects the forward edge 72 can comprise a blunted edge having a thickness that is complementary with a height of the backside face 42 of the underside ridge 40. In other embodiments where the computer housing does not include an underside ridge (not shown), the forward edge of the cradle can be sized and shaped to directly align with the lower facet surface as it curves into the bottom surface. With each design, moreover, the forward edge 72 and/or underside surface 76 of the cradle 70 can be configured to align with the lower facet surface 36 of the computer housing 20 to form a substantially smooth and continuous aerodynamic surface 80 (FIG. 13) that extends from the leading edge of the computer housing to at least the rear edge 77 of the cradle 70 when the computer housing is secured within the cradle.

It is contemplated that other orientations for the cradle 70 may be possible, particularly if the coupling member of the computer housing were to extend from a surface of the computer housing other than the bottom surface, such as, for instance, one of the side surfaces. In these embodiments the forward edge of the cradle, whether vertical, horizontal, or tilted, may also be configured to align with a rearward-extending front or side surface of the computer housing to form a substantially smooth and continuous aerodynamic surface that extends from the leading edge of the computer housing to at least the rear edge of the cradle when the computer housing is secured within the cradle.

As described above, the two coupling members can form a rotary-type attachment system in which the first coupling member 48 rotatably engages with the second coupling member 78. It will be appreciated, however, that other types of coupling members and systems for removably securing the computer housing 20 to the computer mount 50 are also possible, including but not limited to linear vertical mechanical engagement, linear lateral mechanical engagement, magnetic engagement, and the like, all of which may be considered to fall within the scope of the present disclosure.

In one aspect the first coupling member 48 can be a male coupler that is fixed to or integral with the computer housing 20, and the second coupling member 78 can be a female receiver that is formed into or integral with the cradle 70. In this embodiment the male coupler 48 can be inserted into the female receiver 78, with the entire computer housing 20 then being rotated into mechanical locking engagement with the cradle 70. Furthermore, with coupling designs in which the entire computer housing 20 is rotated into locking engagement with the cradle 70, both the forward edge 72 of the cradle 70 and the backside face 42 of the underside ridge 40 can also be curved so that the two surfaces can enter into complementary slidable engagement during rotation of the computer housing 20 into a locking engagement with the top surface 74 of the cradle 70. As shown in FIGS. 13 and 15, this can result in an uninterrupted and smooth joint 82 between the lower facet surface 36 of the computer housing 20 and the underside surface 76 of the cradle 70 that maintains a substantially smooth or laminar flow of air along the underside of the cycling computer.

FIGS. 13-17 illustrate the mounted cycling computer 10 with the computer housing 20 being rotating into locked engagement with the cradle 70, so that the lower facet surface 36 of the computer housing 20 and the underside surface 76 of the cradle 70 align to form a substantially smooth and continuous aerodynamic surface 80 from the leading edge 32 of the computer housing to a rear edge 77 of the cradle. This surface 80 can contribute to an overall integrated aerodynamic shape that can minimize the aerodynamic resistance and drag that is created by the cycling computer 10 during a bike ride. Also shown in the figures, the underside surface 66 of the bracket arm 64 can also be curved and complementary with the underside surface 76 of the cradle 70, so as to extend the substantially smooth and continuous aerodynamic surface 80, in one aspect, from the leading edge 32 of the computer housing 20 to the lower trailing edge 67 of the computer mount 50. As described above, in one aspect the interface between the lower facet surface 36 and the forward edge 72 of the cradle 70 can define a joint 82 that extends across the width of the computer housing 20 or from side-to-side 46 of the computer housing 20. Moreover, the joint 82 can generally be located between the front end 30 and the back end 38 of the computer housing.

In addition to the above advantages, the smooth and continuous underside surface 80 that extends from the leading edge 32 of the computer housing 20 to the rear edge 77 of the cradle 70 can allow for adjustment in the pitch or angle-of-attack of the cycling computer 10 relative to the handlebars and frame of the bicycle. For instance, it will be appreciated that the top surface 22 of the computer housing 20 can be angularly rotated from a substantially horizontal orientation (FIGS. 2, 13) to an angular orientation that is at least 6 degrees or more above horizontal (FIG. 17) without negatively affecting the improved aerodynamics provided by the cycling computer 10. This flexibility can provide for a substantial range of angular adjustment 86 for meeting a particular rider's set-up preferences for a favorable view angle with improved ergonomics and readability of the computer display 24 that can be located at the top surface 22 of the computer housing 20, without sacrificing the improved aerodynamic performance.

Figure 17:
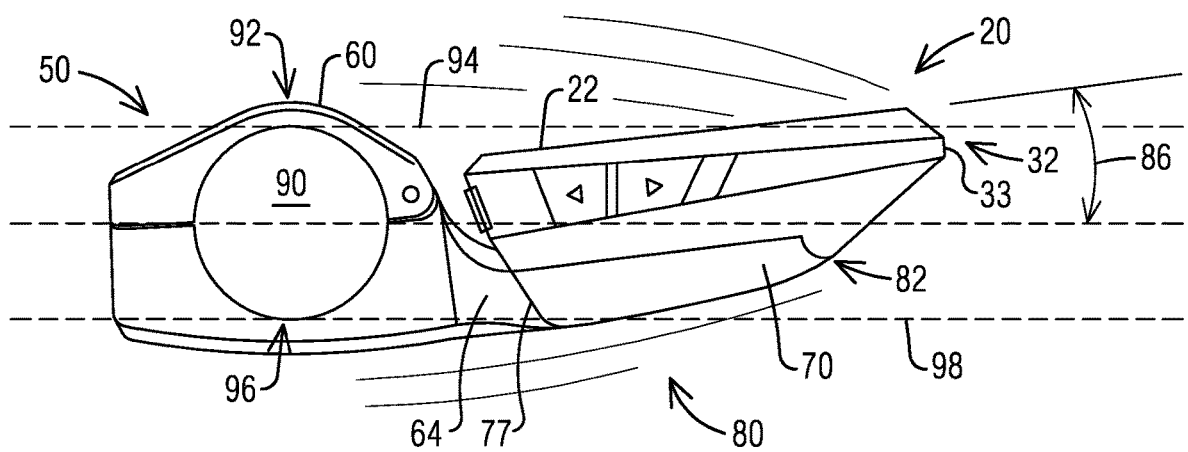
FIG. 17 is a side schematic view of the assembled and upwardly-angled cycling computer of FIG. 13 illustrating the airflow around the apparatus.

Also shown in FIG. 17, in one aspect the front edge 33 or center facet of the leading edge profile 32 can be positioned at a height that is between an upper plane 94 defined by the top surface 92 of the handlebar 90 and a lower plane 98 defined by the bottom surface 96 of the handlebar, so that the front edge 33 does not rise above or extend below a forwardly-extending zone defined by the thickness or diameter of the handlebars. Moreover, the computer mount 50 can also be rotatable around the handlebar 90 through a range of angles 86 or angular orientations up to about 6 degrees, while maintaining the height of the leading edge 33 between the upper plane 94 and the lower plane 94 in front of the handlebars so as to provide a range of favorable viewing angles.

Figure 18:
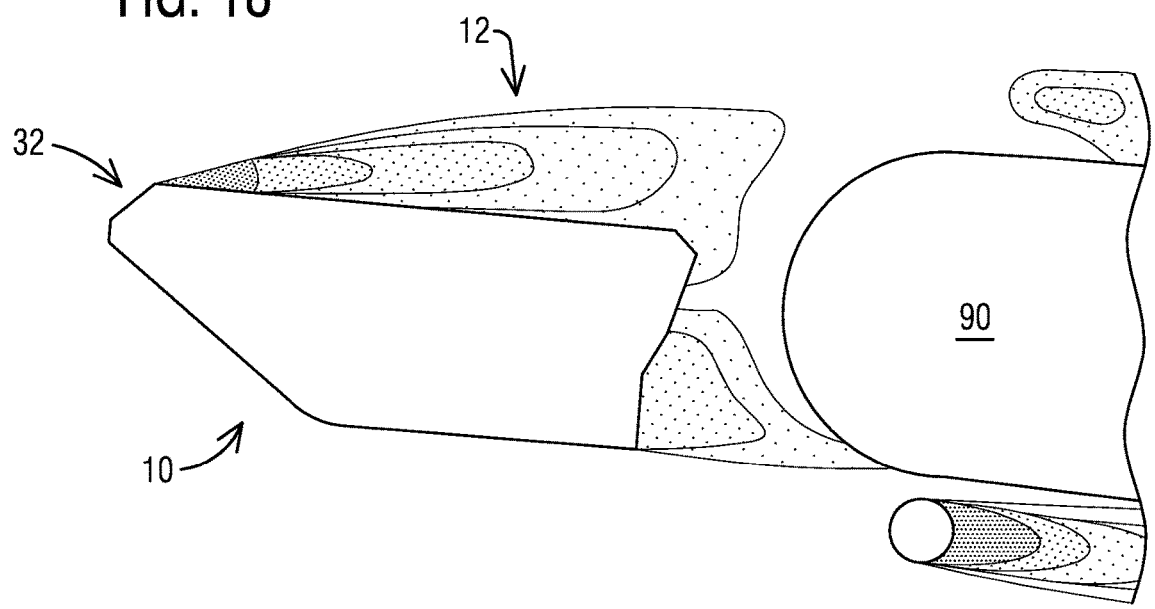
FIG. 18 is a close-up side schematic view of a CFD (Computational Fluid Dynamics) study of the assembled cycling computer of FIG. 1.
Figure 19:
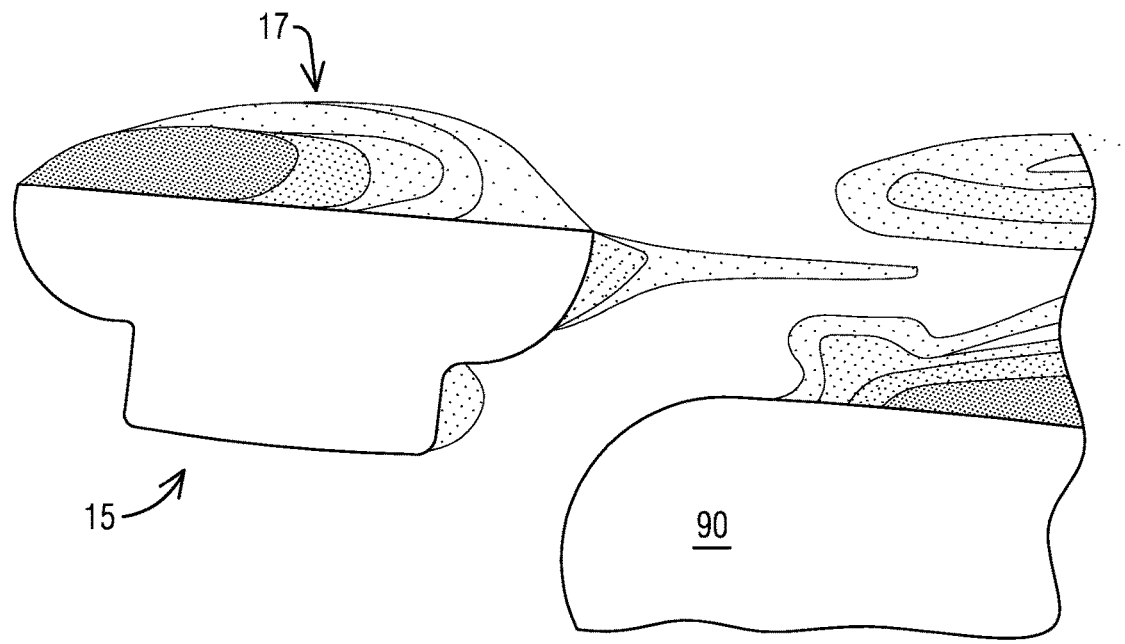
FIG. 19 is a close-up side schematic view of a CFD study of a competing cycling computer.

FIGS. 18 and 19 provide a comparison in aerodynamic performance between the cycling computer 10 of the present disclosure (FIG. 18) and competing cycling computer 15 available in the art (FIG. 19). For example, when tested under identical conditions the competing cycling computer 15 generates a zone 17 of aerodynamic resistance or drag coming off the leading edge of the computer housing that is more intense (i.e. darker in the figures) than a comparable zone 12 coming off the leading edge 32 of the disclosed design 10.

Figure 20:
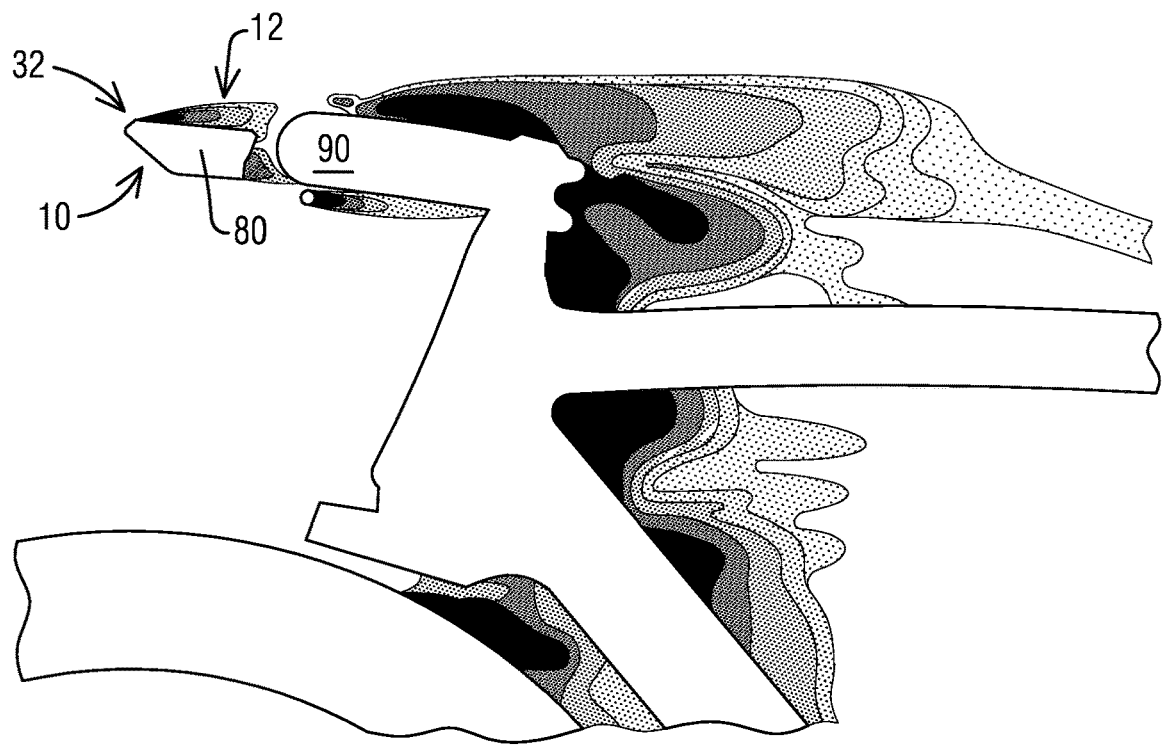
FIG. 20 is an expanded side schematic view of the CFD study of FIG. 18 of the assembled cycling computer of the present disclosure.
Figure 21:
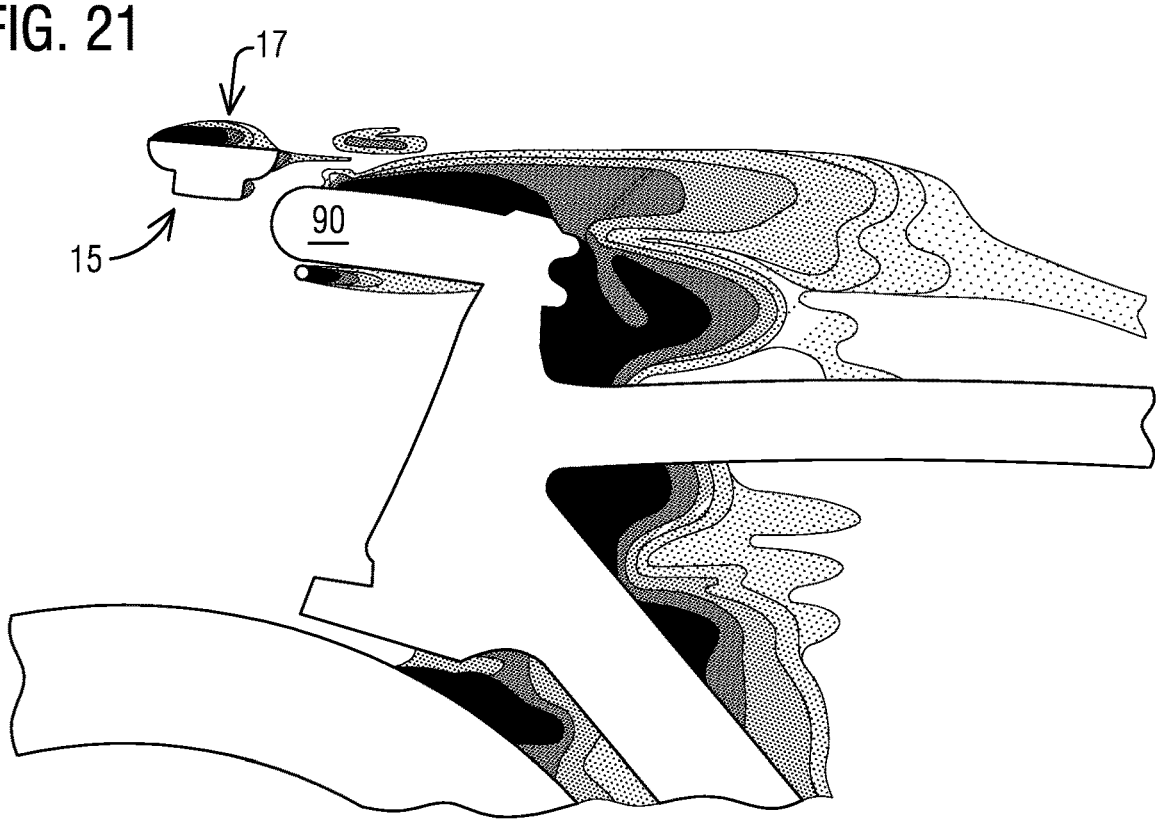
FIG. 21 is an expanded side schematic view of the CFD study of FIG. 19 of a competing cycling computer.

A similar affect can be shown in FIGS. 20 and 21, which have been expended to include the handlebars, stem and frame found at the front of the bicycle. Although not easily visible in the non-colored figures, the degree of aerodynamic resistance and drag created by mounted cycling computers is significantly reduced with the cycling computer 10 of the present disclosure. Indeed, it is contemplated that aerodynamic coupling between the cycling computer 10 and the handlebars 90, when considered as a combined system, may lead to increased beneficial affects. For instance, in one aspect the under-slung design of the computer mount 50 can be used to position the underside ridge 40 of the computer housing 20 at a level that is substantially equal with the underside of the handlebar 90, so that the laminar airflow around the apparatus can be briefly directed downward by the smooth and continuous underside surface 80 but then be allowed to curved back upwards toward the handlebar before merging in a smooth and continuous manner with the bulk air flowing across the underside of the handlebar, as shown in FIG. 20. Likewise, the top surface 22 of the computer housing 20 can be positioned below the level of the topside of the handlebar 90, so that the re-directed airflow passing over the top of the computer housing 20 can smoothly merge with the bulk air flowing over the topside of the handlebar, also shown in FIG. 20.

Figure 7:
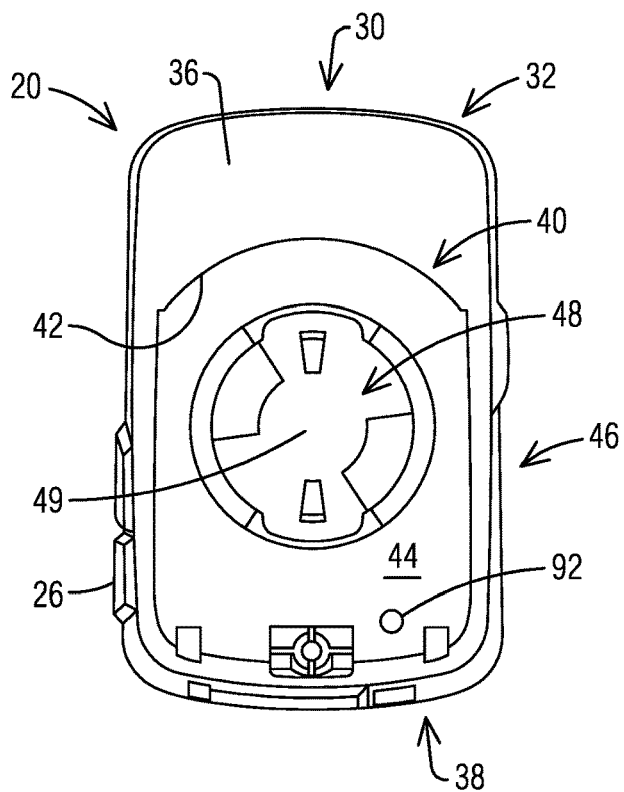
FIG. 7 is a bottom view of the computer housing of FIG. 3.

Referring now to FIGS. 5, 7, 12 and 15, among others, in one alternative embodiment the cycling computer 10 may further include an additional fastening mechanism to fixedly secure or fasten the computer housing 20 to the computer mount 50. In the example illustrated, a screw 94 is shown with an attendant open aperture 90 in the computer mount (FIGS. 12, 15) and a threaded aperture 92 formed into the underside surface of the computer housing 20 (FIGS. 5, 7). It will be appreciated that the cycling computer 10 can include 9 fastening mechanism in addition to the releasable coupling mechanism involving the first coupling member 48 that is twist locked to the mating second coupling member 78. Once rotated into the operational position, the open aperture 90 and the threaded aperture 92 align, and the screw 94 may be inserted through the open aperture to engage the threaded aperture to fixedly (non-removably) secure or fasten the computer housing 20 to the computer mount 50. Other fixed coupling or fastening arrangements (e.g., a fastening arrangement involving a member, such as a screw, bolt, pin, or the like that would require a tool to disconnect the member) are also possible. It will be further understood that in various additional embodiments it is also possible to have only a fixed fastening mechanism or only a twist lock or other removable coupling mechanism.

In various cycling organizations, strict weight limits may be placed on bicycles used in competition. For example, under current USA cycling rules, for all road, cyclo-cross and track events there is a minimum weight requirement of 6.8 kg (14.99 lb.). Hence, any bicycle used in such competitions must weight 14.99 lbs. or more. The rule states "[u]ltra-light road bikes and many track bikes may weigh less than the minimum weight. These are not allowed without adding additional weight to the bicycle to achieve the minimum weight. Water bottles, tool bags, pumps and such items that can simply be removed from the bike are not counted in the minimum required weight." By fixedly securing the cycling computer to the mount through the additional fastening mechanism, the cycling computer assembly (computer and mount) may be counted in the overall weight measurement in some organizations. While not weighing particularly much, each ounce may count when ensuring a bicycle is compliant with weigh limits. Conventional cycling computers are typically only removably attached and there is no supplemental fixed coupling or fastening mechanism. Unexpectedly, having the computer integrally and permanently formed with the bicycle may be important, particularly as overall bicycle weights continue to be reduced despite the presence of strict racing weight limits. Moreover, the fastening mechanism can also provide additional security from theft as the computer housing cannot be simply detached from the computer mount without a tool to remove the screw.

As indicated above, the cycling computer of the present disclosure has been described herein in terms of preferred embodiments and methodologies considered by the inventor to represent the best mode of carrying out the invention. It will be understood by the skilled artisan, however, that a wide range of additions, deletions, and modifications, both subtle and gross, may be made to the illustrated and exemplary embodiments of the cycling computer without departing from the spirit and scope of the invention. These and other revisions might be made by those of skill in the art without departing from the spirit and scope of the invention that is constrained only by the following claims.

What is claimed is:

1. A cycling computer for mounting to a front of a bicycle, the cycling computer comprising:
   a computer housing for enclosing and protecting an electronics package, the computer housing including:
   a front end having a wedge-shaped profile defined by a leading edge and a lower front surface extending rearward and downward from the leading edge to a bottom surface of the computer housing; and
   a first coupling member formed into the bottom surface of the computer housing; and
   a computer mount having a mounting adapter at a proximal end for coupling to the front of the bicycle, a cradle at a distal end for removably receiving the computer housing, and a bracket arm extending between the mounting adapter and the cradle, the cradle including:
   a second coupling member formed into an upper side of the cradle and engageable with the first coupling member to removably secure the computer housing to the cradle, the computer mount positioning the computer housing forward from the front of the bicycle and aligned with a width of a handlebar of the bicycle; and
   a curved underside surface extending rearward from a forward edge that is sized and shaped to align with the lower front surface of the computer housing and to form a continuous surface extending from the leading edge of the computer housing to a rear edge of the cradle when the computer housing is secured within the cradle.

2. A cycling computer for mounting to a front of a bicycle, the cycling computer comprising:
   a computer housing for enclosing and protecting an electronics package, the computer housing including:
   a front end having a wedge-shaped profile defined by a leading edge and a lower front surface extending rearward and downward from the leading edge to a bottom surface of the computer housing; and
   a first coupling member formed into the bottom surface of the computer housing; and
   a computer mount having a mounting adapter at a proximal end for coupling to the front of the bicycle, a cradle at a distal end for removably receiving the computer housing, and a bracket arm extending between the mounting adapter and the cradle, the cradle including:
   a second coupling member formed into an upper side of the cradle and engageable with the first coupling member to removably secure the computer housing to the cradle; and
   a curved underside surface extending rearward from a forward edge that is sized and shaped to align with the lower front surface of the computer housing and to form a substantially smooth and continuous aerodynamic surface extending from the leading edge of the computer housing to a rear edge of the cradle when the computer housing is secured within the cradle,
   wherein an underside surface of the bracket arm is convex and complementary with the underside surface of the cradle to extend the substantially smooth and continuous aerodynamic surface from the leading edge of the computer housing to a trailing edge of the computer mount.

3. The cycling computer of claim 1, wherein the lower front surface extends rearward and downward beyond the bottom surface of the computer housing to form a downwardly-projecting underside ridge with a backside face.

4. The cycling computer of claim 3, wherein the forward edge of the cradle is sized and shaped to be complementary with the backside face of the underside ridge.

5. The cycling computer of claim 4, wherein the forward edge of the cradle further comprises a blunted edge having a thickness that is complementary with a height of the backside face of the underside ridge.

6. The cycling computer of claim 3, wherein the first coupling member is a male coupler and the second coupling member is a female receiver, with the male coupler being inserted into the female receiver and the computer housing rotated into locked engagement with the cradle.

7. The cycling computer of claim 6, wherein both the forward edge of the cradle and the backside face of the underside ridge are curved for complementary slidable engagement therebetween during rotation of the computer housing into locked engagement with the cradle.

8. The cycling computer of claim 3, wherein the underside ridge of the computer housing is substantially level with a lower plane defined by a bottom surface of a handlebar of the bicycle.

9. The cycling computer of claim 1, wherein the wedge-shaped profile of the front end is further defined by an upper front facet surface and a lower front facet surface.

10. The cycling computer of claim 9, wherein sides of the computer housing include a faceted side edge profile having at least an upper side facet surface that merges smoothly with the upper front facet surface, and a lower side facet surface that merges smoothly with the lower front facet surface.

11. The cycling computer of claim 1, wherein an interface between the lower front surface of the computer housing and the forward edge of the cradle defines a joint that extends from side-to-side of the computer housing.

12. The cycling computer of claim 11, wherein the joint between the lower front surface of the computer housing and the forward edge of the cradle is located between front and back ends of the computer housing.

13. The cycling computer of claim 1, wherein the mounting adapter further comprises a coupling ring configured to clamp around a substantially-horizontal portion of a handlebar with the computer mount in an orientation that supports and secures the computer housing in front of the handlebar, and
  wherein the leading edge of the computer housing is positioned at a height between an upper plane defined by a top surface of the handlebar and a lower plane defined by a bottom surface of the handlebar.

14. The cycling computer of claim 13, wherein the computer mount is rotatable around the handlebar through a range of at least about six degrees while maintaining the height of the leading edge between the upper plane and the lower plane in front of the handlebar to provide a range of favorable viewing angles.

15. The cycling computer of claim 13, wherein the bracket arm is offset to one side of the cradle to enable positioning of the computer housing in front of a center of the handlebar.

16. The cycling computer of claim 15, further comprising a continuously curved transition section between the cradle and the bracket arm.

17. The cycling computer of claim 1, wherein the computer housing includes an electronic display formed into a top surface thereof.

18. A cycling computer for mounting to a front of a bicycle, the cycling computer comprising:
  a computer housing for enclosing and protecting an electronics package and having an electronic display formed into a top surface thereof, the computer housing including:
    a front end having a leading edge profile defined by a lower facet surface, the lower facet surface extending rearward and downward beyond a bottom surface of the computer housing to form a projecting underside ridge with a backside face; and
    a first coupling member extending downward from the bottom surface of the computer housing behind the underside ridge; and
  a computer mount having a mounting adapter at a proximal end for coupling to the front of the bicycle, a cradle at a distal end for removably receiving the computer housing, and a bracket arm extending between the mounting adapter and the cradle, the cradle including:
    a forward edge sized and shaped to be complementary with the backside face of the underside ridge to form a smooth surface between the bottom surface and a convex underside surface extending rearward from the forward edge; and
    a second coupling member behind the forward edge and engageable with the first coupling member to removably secure the computer housing to the cradle,
    wherein the lower facet surface of the computer housing and the convex underside surface of the cradle align to form a substantially smooth and continuous aerodynamic surface from the leading edge of the computer housing to a rear edge of the cradle when the computer housing is secured within the cradle.

19. A cycling computer for mounting to a front of a bicycle, the cycling computer comprising:
  a computer housing for enclosing and protecting an electronics package and having an electronic display formed into a top surface thereof, the computer housing including:
    a bottom surface;
    a front end having a leading edge profile defining a surface extending rearward and downward, the surface terminating at a projecting underside ridge defining a rearward facing surface, the rearward facing surface extending below the bottom surface; and
    a first coupling member extending downward from the bottom surface of the computer housing, the first coupling member being rearward of the face; and
  a computer mount having a mounting adapter at a proximal end for coupling to the front of the bicycle, a cradle at a distal end for removably receiving the computer housing, and a bracket arm extending between a lower portion of the mounting adapter and the cradle, the cradle including:
    a forward edge sized and shaped to be complementary with and about the rearward facing surface of the underside ridge to form a smooth downward facing surface between the surface of the leading edge profile and an underside surface of the cradle extending rearward from the forward edge; and
    a second coupling member behind the forward edge and engageable with the first coupling member to removably secure the computer housing to the cradle.

20. The cycling computer of claim 18, wherein side surfaces of the computer housing taper continuously outwardly from the front end to a back end.

21. A cycling computer for mounting to a front of a bicycle, the cycling computer comprising:
  a computer housing for enclosing and protecting an electronics package and having an electronic display formed into a top surface thereof, the computer housing including:
    a front end having a leading edge profile defined by a lower facet surface, the lower facet surface extending from a leading edge rearward and downward beyond a bottom surface of the computer housing to form a projecting underside ridge with a backside face; and
    a first coupling member extending downward from the bottom surface of the computer housing behind the underside ridge;
  a computer mount having a mounting adapter at a proximal end for coupling to the front of the bicycle, a cradle at a distal end for removably receiving the computer housing, and a bracket arm extending between a lower portion of the mounting adapter and the cradle, the cradle including:
    a forward edge sized and shaped to be complementary with the backside face of the underside ridge to form a smooth surface between the lower facet surface and a curved underside surface extending rearward from the forward edge;
    a second coupling member behind the forward edge and engageable with the first coupling member to removably secure the computer housing to the cradle;
    wherein the lower facet surface of the computer housing and the curved underside surface of the cradle align to form a substantially smooth and continuous aerodynamic surface from the leading edge of the computer housing to a rear edge of the cradle when the computer housing is secured within the cradle, and
    an underside surface of the bracket arm is curved and complementary with the underside surface of the cradle to extend the substantially smooth and continuous aerodynamic surface from the leading edge of the computer housing to a trailing edge of the computer mount;
  wherein the mounting adapter further comprises a coupling ring configured to clamp around a substantially-horizontal portion of a handlebar with the computer mount in an orientation that supports and secures the computer housing in front of the handlebar.

22. The cycling computer of claim 1 further comprising:
a fastening mechanism interconnected directly between the computer housing and the computer mount, the fastening mechanism to fixedly secure the computer housing to the computer mount.

23. The cycling computer of claim 22 wherein:
the computer housing comprises a front end having wedge-shaped profile defined by a leading edge and a lower front surface extending rearward and downward from the leading edge to the bottom surface of the computer housing; and
the computer mount comprises a curved underside surface extending rearward from a forward edge that is sized and shaped to align with the lower front surface of the computer housing and form a substantially smooth and continuous aerodynamic surface from the leading edge of the computer housing to a rear edge of the cradle when the computer housing is secured within the cradle.

24. The cycling computer of claim 23 wherein:
the computer housing defines a threaded aperture;
the computer mount defines an open aperture aligned with the threaded aperture when the computer housing is secured with the computer mount by way of the first coupling member and the second coupling member; and
the fastening mechanism comprises a screw extending through the open aperture and engaged within the threaded aperture.

\* \* \* \* \*